(12) United States Patent
Lilak et al.

(10) Patent No.: US 12,288,807 B2
(45) Date of Patent: Apr. 29, 2025

(54) AMORPHIZATION AND REGROWTH OF SOURCE-DRAIN REGIONS FROM THE BOTTOM-SIDE OF A SEMICONDUCTOR ASSEMBLY

(71) Applicant: Intel Corporation, Santa Clara, CA (US)

(72) Inventors: Aaron Lilak, Beaverton, OR (US); Rishabh Mehandru, Portland, OR (US); Willy Rachmady, Beaverton, OR (US); Harold Kennel, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/367,843

(22) Filed: Sep. 13, 2023

(65) Prior Publication Data

US 2024/0006489 A1    Jan. 4, 2024

Related U.S. Application Data

(62) Division of application No. 16/457,690, filed on Jun. 28, 2019, now Pat. No. 11,798,991.

(51) Int. Cl.
*H01L 29/08* (2006.01)
*H01L 21/02* (2006.01)
*H01L 21/8238* (2006.01)

(52) U.S. Cl.
CPC .... *H01L 29/0847* (2013.01); *H01L 21/02356* (2013.01); *H01L 21/02592* (2013.01); *H01L 21/823807* (2013.01); *H01L 21/823814* (2013.01); *H01L 21/823828* (2013.01); *H01L 21/823871* (2013.01)

(58) Field of Classification Search
CPC .......... H01L 29/0847; H01L 21/02356; H01L 21/02592; H01L 21/823814; H01L 21/823828; H01L 21/823871
USPC ......................................................... 257/401
See application file for complete search history.

(56) References Cited

U.S. PATENT DOCUMENTS

| | | |
|---|---|---|
| 6,291,302 B1 | 9/2001 | Yu |
| 6,368,947 B1 | 4/2002 | Yu |
| 6,455,383 B1 | 9/2002 | Wu |
| 6,642,122 B1 | 11/2003 | Yu |
| 6,844,250 B1 | 1/2005 | Wang |
| 9,978,750 B1 | 5/2018 | Adusumilli |
| 2004/0087120 A1 | 5/2004 | Feudel |

(Continued)

OTHER PUBLICATIONS

Extended European Search Report for European Patent Application No. 20165849.9, mailed Sep. 4, 2020, 10 pgs.

(Continued)

*Primary Examiner* — Dzung Tran
(74) *Attorney, Agent, or Firm* — Schwabe, Williamson & Wyatt, P.C.

(57) ABSTRACT

A device is disclosed. The device includes a channel, a first source-drain region adjacent a first portion of the channel, the first source-drain region including a first crystalline portion that includes a first region of metastable dopants, a second source-drain region adjacent a second portion of the channel, the second source-drain region including a second crystalline portion that includes a second region of metastable dopants. A gate conductor is on the channel.

9 Claims, 12 Drawing Sheets

(56) References Cited

U.S. PATENT DOCUMENTS

| | | | |
|---|---|---|---|
| 2005/0045995 A1* | 3/2005 | Ieong | H01L 21/76278 |
| | | | 257/E21.415 |
| 2005/0247977 A1 | 11/2005 | Noda | |
| 2017/0213739 A1 | 7/2017 | Gluschenkov | |
| 2018/0261597 A1 | 9/2018 | Adusumilli | |
| 2019/0131399 A1 | 5/2019 | Liu | |
| 2019/0181012 A1 | 6/2019 | Gluschenkov | |

OTHER PUBLICATIONS

Office Action from European Patent Application No. 20165849.9, mailed Feb. 21, 2022, 7 pgs.

\* cited by examiner

AMORPHIZATION AND REGROWTH OF SOURCE-DRAIN REGIONS FROM THE BOTTOM-SIDE OF A SEMICONDUCTOR ASSEMBLY

CROSS-REFERENCE TO RELATED APPLICATIONS

This application is a division of U.S. patent application Ser. No. 16/457,690, filed on Jun. 28, 2019, the entire contents of which is hereby incorporated by reference herein.

TECHNICAL FIELD

Embodiments of the disclosure pertain to amorphization and regrowth of source-drain regions and, in particular, to amorphization and regrowth of source-drain regions from a bottom-side of a semiconductor assembly.

BACKGROUND

Achieving high levels of dopant activation adjacent to semiconductor contact regions lowers contact resistance and leads to reduced power consumption and faster switching speeds. There are various approaches to achieving high dopant activation. In some approaches contact structures are formed in front-end processing operations during transistor fabrication. However, these contact structures are subjected to thermal operations associated with back-end processing that can result in high contact resistance. The high contact resistance can degrade device performance by resulting in low speeds and increased power consumption.

DESCRIPTION OF THE EMBODIMENTS

Figure 1:
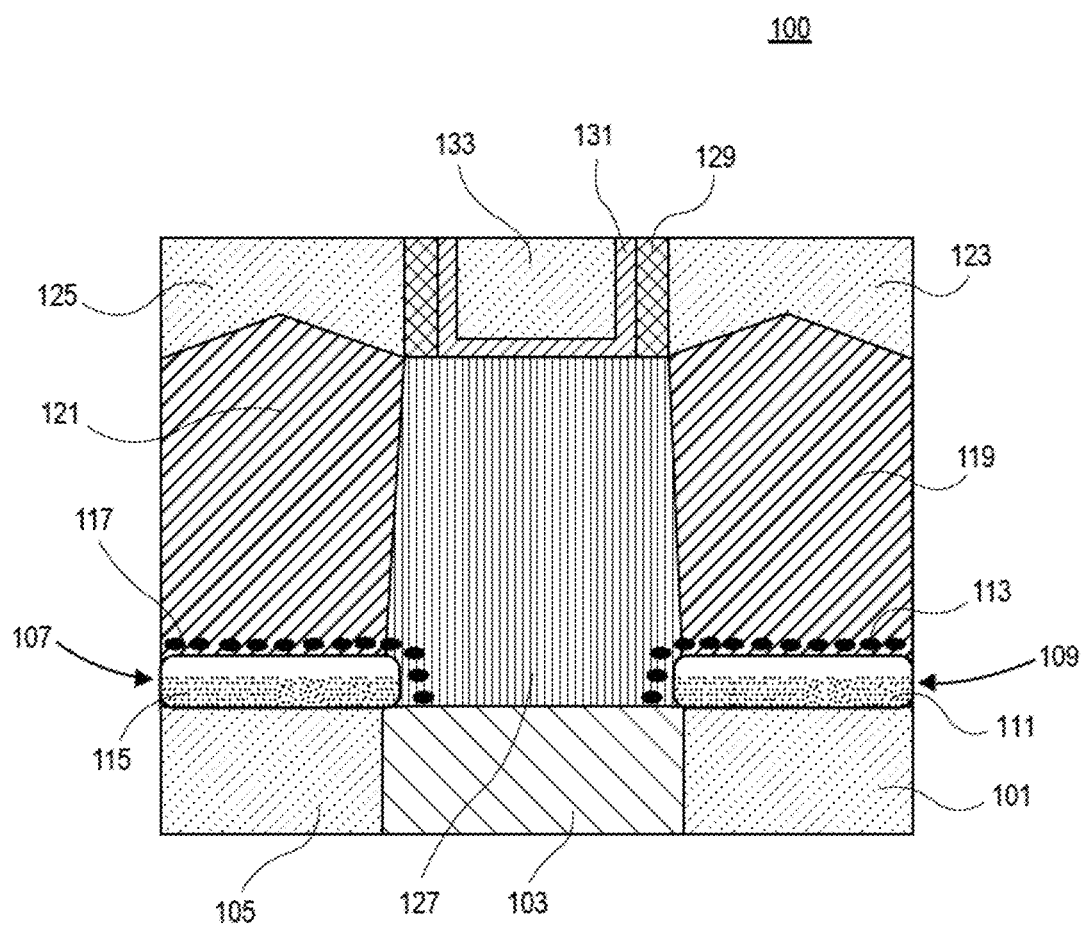
FIG. 1 illustrates a transistor structure with bottom side source-drain region recrystallization according to an embodiment.

Amorphization and regrowth of source-drain region portions from a bottom-side of a semiconductor assembly is described. It should be appreciated that although embodiments are described herein with reference to example amorphization and regrowth of source-drain region portions from a bottom-side implementations, the disclosure is more generally applicable to amorphization and regrowth of source-drain region portions from a bottom-side implementations as well as other type amorphization and regrowth of source-drain region portions from a bottom-side implementations. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As used herein the term metastable is intended to refer to a stable and high state of dopant electrical activation that is greater than a stable and lower state of dopant electrical activation of a dopant. In an embodiment, dopants are activated in a manner that enables the achievement of a high ratio of electrically active to electrically non-active dopants, not only at low dopant concentrations but at higher dopant concentrations. For example, in an embodiment, based on a chemical dopant concentration (sum of electrically inactive and electrically active dopant atoms) of $1e21/cm^3$, a crystallized source-drain region that includes dopants in a highly active metastable state is characterized by a high ratio of electrically active to electrically non-active dopants. In particular, for such a concentration, the ratio of electrically active dopants to electrically non-active dopants can be greater than or equal to 0.5. In other embodiments, other ratios of active dopants to non-active dopants can be achieved. In general, in an embodiment, over a range of dopant concentrations, high levels of dopant activation adjacent semiconductor contacts can be achieved.

Achieving high levels of dopant activation adjacent to semiconductor contact regions lowers contact resistance and leads to reduced power consumption and faster switching speeds. There are various approaches to achieving high dopant activation. In some approaches, contact structures are formed in front-end processing operations during transistor fabrication. However, these contact structures are subjected to thermal operations associated with back-end processing and can be degraded by such. This can cause high contact resistivity which can lead to poor device performance, such as low speeds and increased power consumption.

An approach that addresses the shortcomings of previous approaches is disclosed and described herein. For example, as part of a disclosed process, transistor assemblies can be fabricated with traditional semiconductor processing techniques from the top-side of the semiconductor wafer. However, following top-side processing, the bottom-side of the transistor can be exposed through a backside reveal. The exposed contact region is amorphized with an implant directed into the bottom-side of the wafer. Thereafter, the contact region is recrystallized with a fast anneal technique (such as laser anneal, rapid thermal anneal (RTA), ultra-fast radiometer (UFR), etc.). Following recrystallization, the electrical activation of dopants within the regrown region reaches a highly active metastable state that provides substantially reduced contact resistance. In an embodiment, both single strata semiconductor assemblies and stacked semiconductor assemblies can be used. In an embodiment, as part of the fabrication process, a sacrificial or "colored" material can be inserted beneath the source-drain regions to eliminate the need to use lithography on the backside of the semiconductor wafer. In an embodiment, the highly active dopants reduce contact resistance and enable improved device performance including increased drive current, increased switching speed and reduced power consumption.

FIG. 1 illustrates a transistor structure 100 with bottom side source-drain region recrystallization according to an embodiment. In an embodiment, as shown in FIG. 1, transistor structure 100 can include bottom-side source-drain contact 101, insulating dielectric 103, bottom-side source-drain contact 105, implant 107, implant 109, silicide or germanide region 111, crystal band 113, silicide or germanide region 115, crystal band 117, source-drain region 119, source-drain region 121, top-side source-drain contact 123, top-side source-drain contact 125, channel 127, gate spacer 129, gate dielectric 131, and gate conductor 133.

Referring to FIG. 1, in an embodiment, the bottom-side source-drain contact 101 can be formed below the implant 109. In an embodiment, the bottom-side source-drain contact 105 can be formed below the implant 107. In an embodiment, the silicide or germanide region 111 can be formed in the implant 109. In an embodiment, the silicide or germanide region 115 can be formed in the implant 107. In an embodiment, the crystal band 113 can be formed around the implant 109. In an embodiment, the crystal band 117 can be formed around the implant 107. In an embodiment, the source-drain region 119 can be formed above the implant 109. In an embodiment, the source-drain region 121 can be formed above the implant 107. In an embodiment, the top-side source-drain contact 123 can be formed above source-drain region 119. In an embodiment, the top-side source-drain contact 125 can be formed above source-drain region 121. In an embodiment, the spacer 129 can be formed between the top-side source-drain contact 123 and the top-side source-drain contact 125 and the gate dielectric 131 at first and second sides of the gate conductor 133. In an embodiment, the gate dielectric 131 can be formed around the gate conductor 133. In an embodiment, the spacer 129, the gate dielectric 131 and the gate conductor 133 can be formed above the channel 127. In an embodiment, the channel 127 can be formed between the source-drain region 119 and the source-drain region 121 and above the insulating dielectric 103.

In an embodiment, the formation of the implant 107 and the formation of the implant 109 causes at least a portion of the source-drain region 119 and the source-drain region 121 to change from crystalline to amorphous. Thereafter, in an embodiment, a thermal anneal can be performed that causes the at least a portion of the source-drain region 119 and the source-drain region 121 to recrystallize. In an embodiment, the thermal anneal electrically activates dopant from the implant 107 and the implant 109 and causes it to become metastable. In an embodiment, performing the thermal anneal causes a crystallized band 113 and a crystallized band 117, to develop on a periphery of a portion of the source-drain region 119 and the source-drain region 121, respectively. In an embodiment, the thermal anneal causes the formation of a silicide material or a germanide material 111 and a silicide material or a germanide material 115, adjacent to the source-drain contact 101 and adjacent to the source-drain contact 105, respectively. In an embodiment, the anneal temperature can have a range of 900-1200 C. In other embodiments, the anneal temperature can have other ranges. In an embodiment, an ultrafast anneal technique such as a rapid thermal anneal (RTA), which will have a duration of about 0.25 seconds at peak temperature, an ultra-fast radiometer (UFR) anneal or an ultra-fast anneal that utilizes lamps driven by a capacitor discharge, and have a duration of several milliseconds at peak, can be used to perform the anneal. In other embodiments, a laser anneal can be used which can have a time duration in the nanosecond range. In other embodiments, other anneal techniques that use other temperatures and have other time durations can be used to perform the anneal.

In an embodiment, the formation of the implant 107 and the formation of the implant 109 causes a dopant concentration gradient. In an embodiment, the depth of amorphization caused be the implant 107 and the implant 109 can be determined by the implant specie and energy. In an embodiment, the depth of amorphization caused by the implant 107 and the implant 109 can have other determinants. In an embodiment, the depth of amorphization can be 6 nm. In other embodiments, the depth of amorphization can have other values. In an embodiment, the depth of amorphization can have a depth of 3 nm to 12 nm. In other embodiments, the depth of the amorphization can be greater or lesser than 3 nm to 12 nm. In an embodiment, the lateral amorphization distance can be slightly less than the vertical amorphization depth. In other embodiments, the lateral amorphization distance and the vertical amorphization depth can have other relationships. In an embodiment, the contact resistance can be lower than 1e-9 ohm-cm$^2$. In other embodiments, the contact resistance can have other values.

In an embodiment, the source-drain region contact 101 can be formed from Al, Cu, Co, Ru, Ti, or W. In other embodiment, the source-drain region contact 101 can be formed from other materials. In an embodiment, the insulating dielectric 103 can be formed from an oxide. In other embodiments, the insulating dielectric 103 can be formed from other materials. In an embodiment, the source-drain contact 105 can be formed from Al, Cu, Co, Ru, Ti or W. In other embodiments, the source-drain contact 105 can be formed from other materials. In an embodiment, the implant 107 can be formed from boron, $BF_2$, phosphorus, arsenic, germanium, silicon, xenon, argon, tin or krypton. In an embodiment, the implant 107 can be formed with more than one of boron, $BF_2$, phosphorus, arsenic, germanium, silicon, xenon, argon, tin or krypton. In other embodiments, the implant 107 can be formed from other materials. In an embodiment, the implant 109 can be formed from boron, $BF_2$, phosphorus, arsenic, germanium, silicon, xenon, argon, tin or krypton. In an embodiment, the implant 109 can be formed with more than one of boron, $BF_2$, phosphorus, arsenic, germanium, silicon, xenon, argon, tin or krypton. In other embodiments, the implant 109 can be formed from other materials. In an embodiment, the implant 107 can include the silicide or germanide region 115. In other embodiments, the implant 107 can include other type regions. In an embodiment, the implant 109 can include the silicide or germanide region 111. In other embodiments, the implant 109 can include other type regions. In an embodiment, the crystal band 113 can be formed around the periphery of the implant 109. In an embodiment, the crystal band 117 can be formed around the periphery of the implant 107. In an embodiment, the silicide or germanide region 111 can be formed during an anneal process. In an embodiment, the silicide or germanide region 115 can be formed during an anneal process. In an embodiment, the crystal band 113 can be formed during an anneal process. In an embodiment, the crystal band 117 can be formed during an anneal process. In an embodiment, the source-drain region 119 can be formed from silicon or a silicon alloy such as silicon germanium or silicon carbide. In some implementations epitaxially deposited silicon or silicon alloy may be doped in situ with dopants such as boron, arsenic, or phosphorous. In further embodiments, the source-drain region 119 may be formed using one or more alternate semiconductor materials such as germanium or a group III-V material or alloy. And, in further embodiments, one or more layers of metal and/or metal alloys may be used to form the source and drain regions. In other embodiments the source-drain region 119 can be formed from other materials.

In an embodiment, source-drain region 121 can be formed from silicon or a silicon alloy such as silicon germanium or silicon carbide. In some implementations epitaxially deposited silicon or silicon alloy may be doped in situ with dopants such as boron, arsenic, or phosphorous. In further embodiments, the source-drain region 121 may be formed using one or more alternate semiconductor materials such as germanium or a group III-V material or alloy. And in further embodiments, one or more layers of metal and/or metal alloys may be used to form the source and drain regions. In other embodiments the source-drain region 121 can be formed from other materials. In an embodiment, the top-side source-drain contact 123 can be formed from tungsten, cobalt, nickel, ruthenium, titanium, copper or aluminum. In other embodiments, the top-side source-drain contact 123 can be formed from other materials. In an embodiment, the top-side source-drain contact 125 can be formed from copper, cobalt, nickel, ruthenium, titanium, tungsten, or aluminum. In other embodiments, the top-side source-drain contact 125 can be formed from other materials. In an embodiment, the channel 127 can be formed from Si, SiGe or Ge. In other embodiments, the channel 127 can be formed from other materials. In an embodiment, the gate spacer 129 can be formed from silicon nitride, silicon oxide, silicon carbide, silicon nitride doped with carbon, or silicon oxynitride. In other embodiments, the gate spacer 129 can be formed from other materials. For example, in other embodiments, the gate spacer 129 can be formed of a porous material such as organo-silicate glass or other materials. In an embodiment, the gate spacer 129 can include an airgap or vacuum region. In an embodiment, the gate dielectric 131 can be formed from high-k $SiO_2$. In other embodiments, the gate dielectric 131 can be formed from other materials. In an embodiment, the gate conductor 133 can be formed from hafnium, zirconium, titanium, tantalum, aluminum, ruthenium, palladium, platinum, cobalt, or nickel. In other embodiments, gate conductor 133 can be formed from other materials.

In operation, the highly active dopants that are formed in the source-drain regions 119 and 121 by the implants 107 and 109 act, respectively, to reduce the contact resistances of the bottom-side source-drain contact 101 and the bottom-side source-drain contact 105. These reductions in contact resistance result in improved device performance. For example, based on the reduction in the contact resistance of the bottom-side source-drain contact 101 and the bottom-side source-drain contact 105, the transistor is able to generate increased drive current, operate at increased switching speed and exhibit reduced power consumption.

Figure 2A:
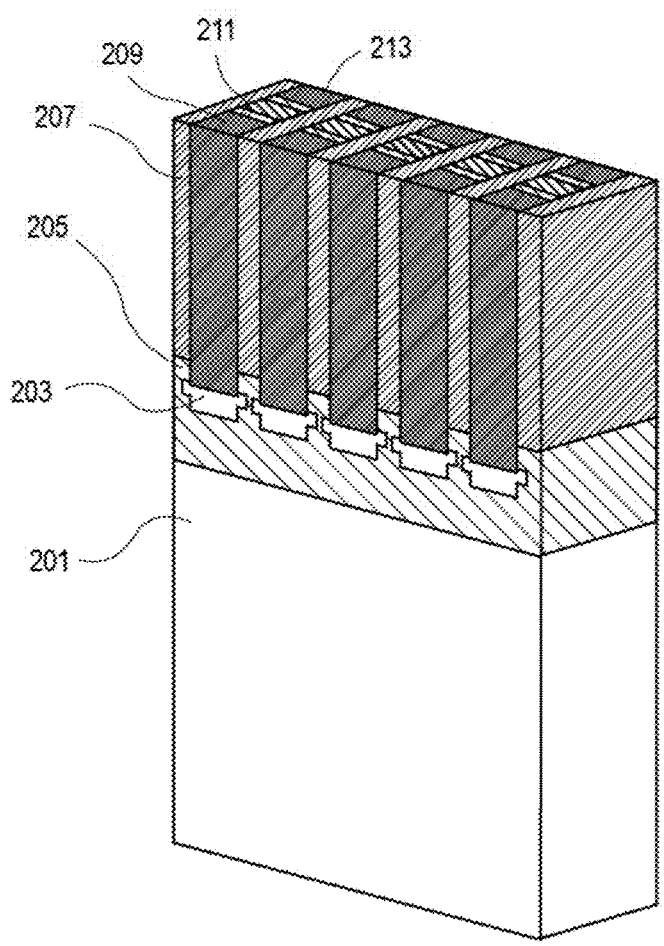
FIGS. 2A-2C illustrate stages in a process for forming transistor structures with bottom-side source-drain region recrystallization according to an embodiment.
Figure 2B:
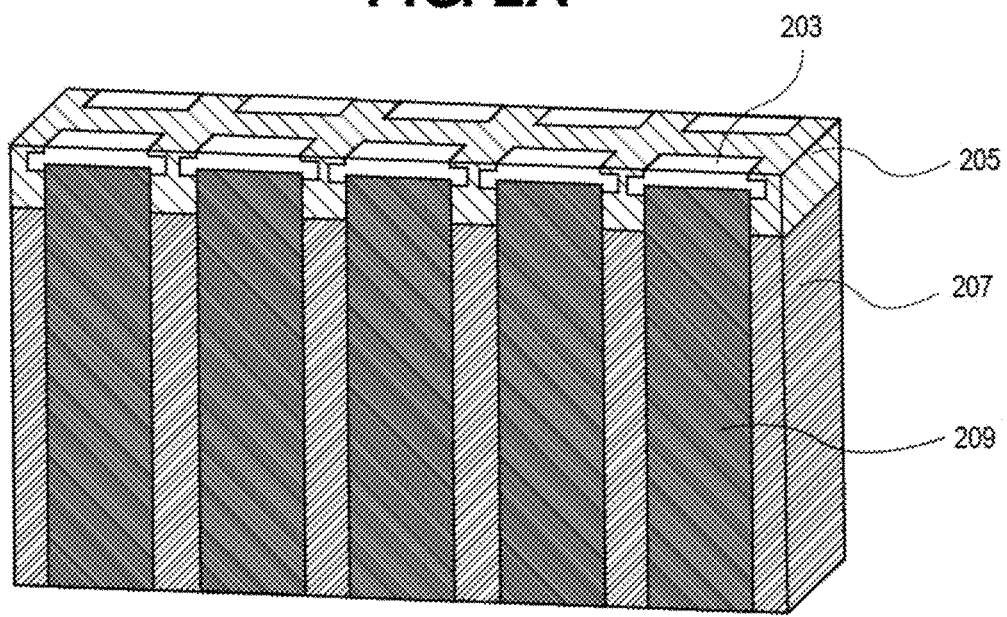
Figure 2C:
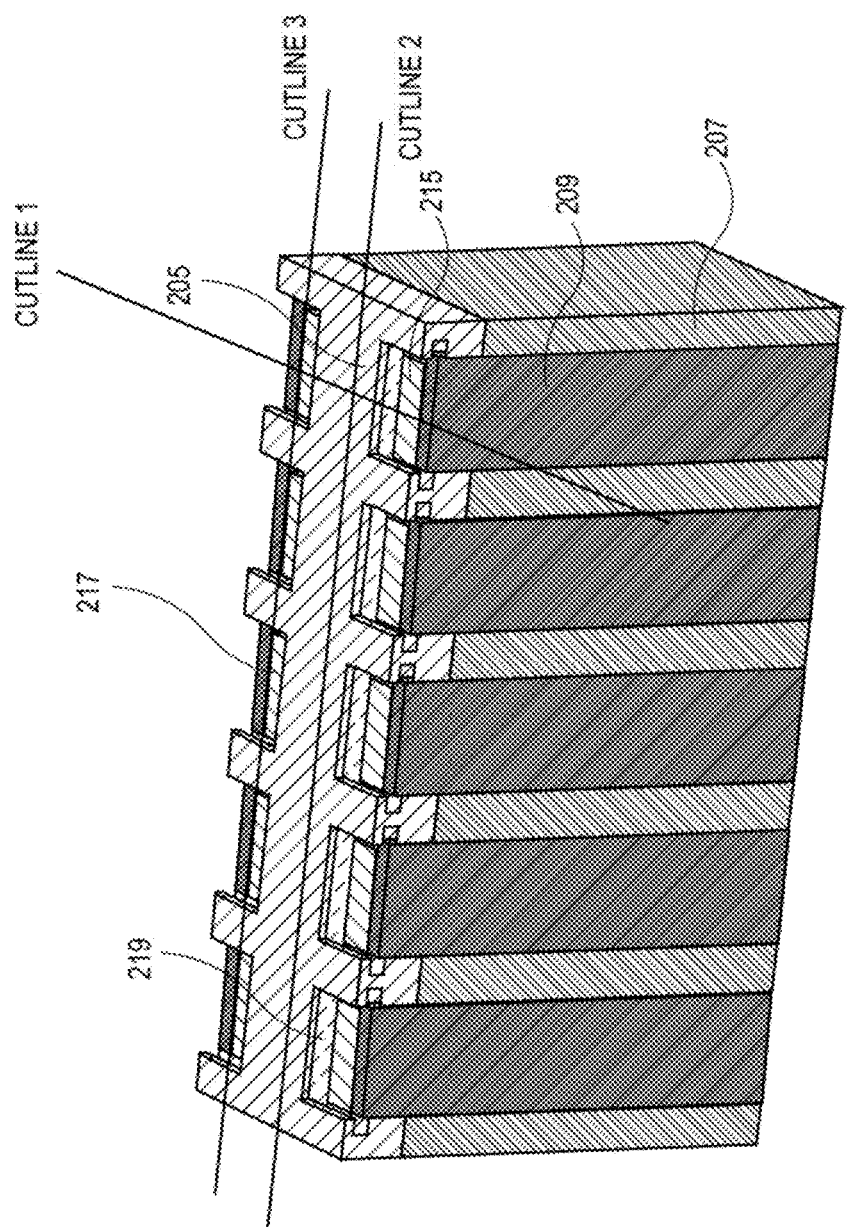

FIG. 2A illustrates a semiconductor structure prior to a process that includes inverting the semiconductor structure and performing bottom side source-drain region processing according to an embodiment. In the FIG. 2A embodiment, the semiconductor structure includes substrate 201, sacrificial material 203, dielectric structure 205, dielectric structure 207, source-drain region 209, spacers 211 and source-drain region 213. FIG. 2B shows the semiconductor structure of FIG. 2A after it has been inverted and with the substrate 201 removed. In particular, FIG. 2B shows the bottom side of the semiconductor structure with the sacrificial material 203 exposed. FIG. 2C illustrates the semiconductor structure after the sacrificial material 203 has been removed to expose the source-drain regions of the semiconductor structure. It is at this phase of the process that an ion implantation of dopants into the source-drain regions of the semiconductor structure can be performed as part of an amorphization and a recrystallization of the source-drain regions that are used to electrically activate dopants to reach a highly-active metastable state that provides substantially reduced contact resistance. These processes are discussed in detail herein with reference to FIGS. 3A-3G and 4A-4C. FIG. 2C shows in addition to structures shown in FIGS. 2A and 2B, source-drain regions 215, source-drain regions 217, and dielectric layer 219. Also, shown in FIG. 2C are cutline 1, cutline 2 and cutline 3 that demarcate the places where cross-sections used in the description of the semiconductor structures described with reference to FIGS. 3A-3G and FIGS. 4A-4C are centered. For example, FIGS. 3A-3E show cross-sections of a semiconductor structure with a cut centered parallel to the fin of the semiconductor structure and based on a cutline that corresponds cutline 1. FIG. 3F shows a cross-section of a semiconductor structure with a cut that is centered perpendicular to the fin of the semiconductor structure through the gate region and that is based on a cutline that corresponds to cutline 2. FIG. 3G shows a cross-section of a semiconductor structure with a cut that is centered perpendicular to the fin of the semiconductor structure through the source-drain region that is based on a cutline that corresponds to cutline 3.

Figure 3A:
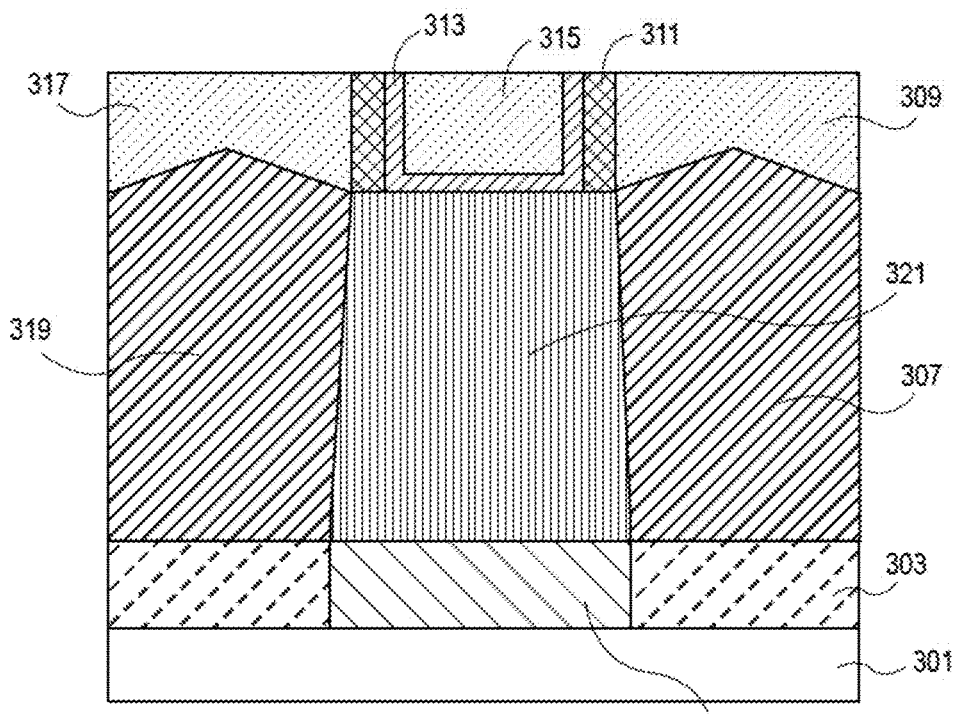
FIGS. 3A-3G illustrate cross-sections of a transistor structure at stages during the process for forming a transistor structure with bottom-side source-drain region recrystallization according to an embodiment.
Figure 3B:
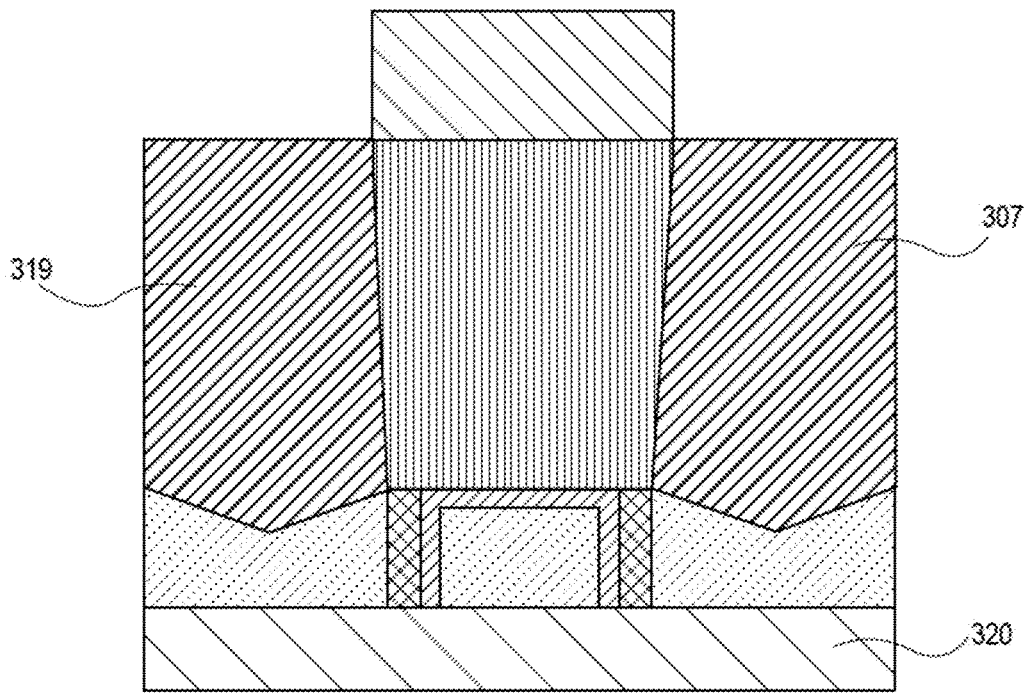
Figure 3C:
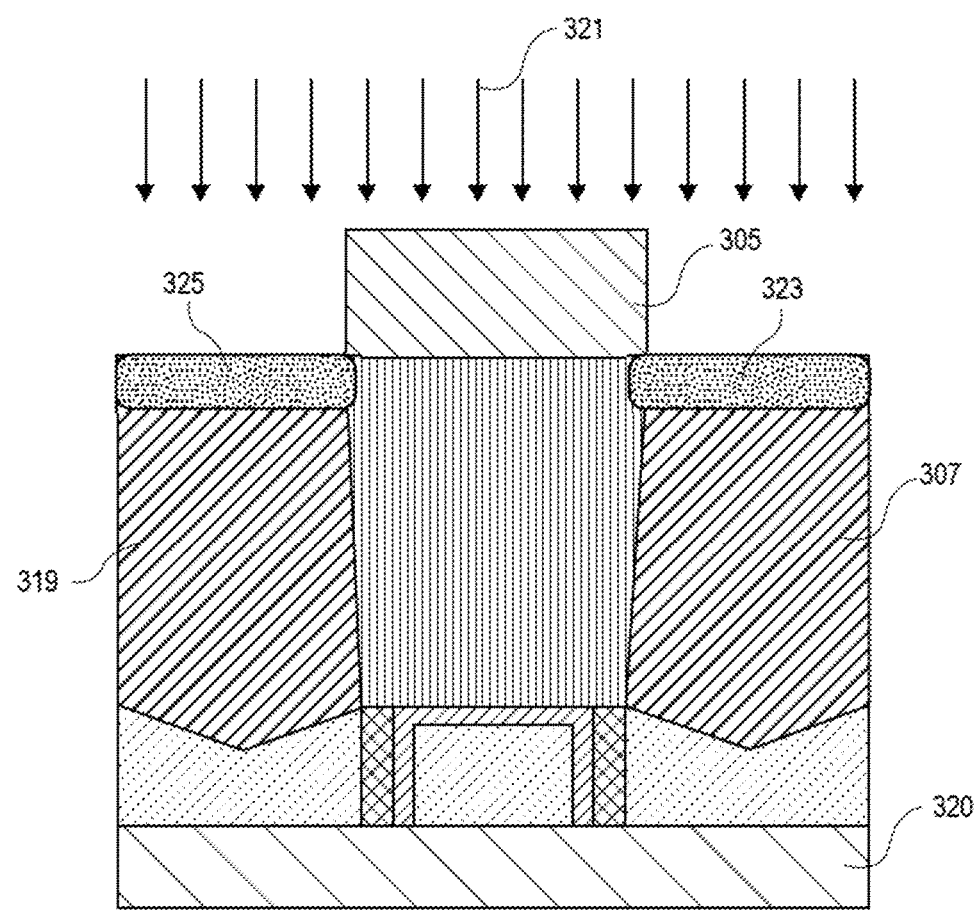
Figure 3D:
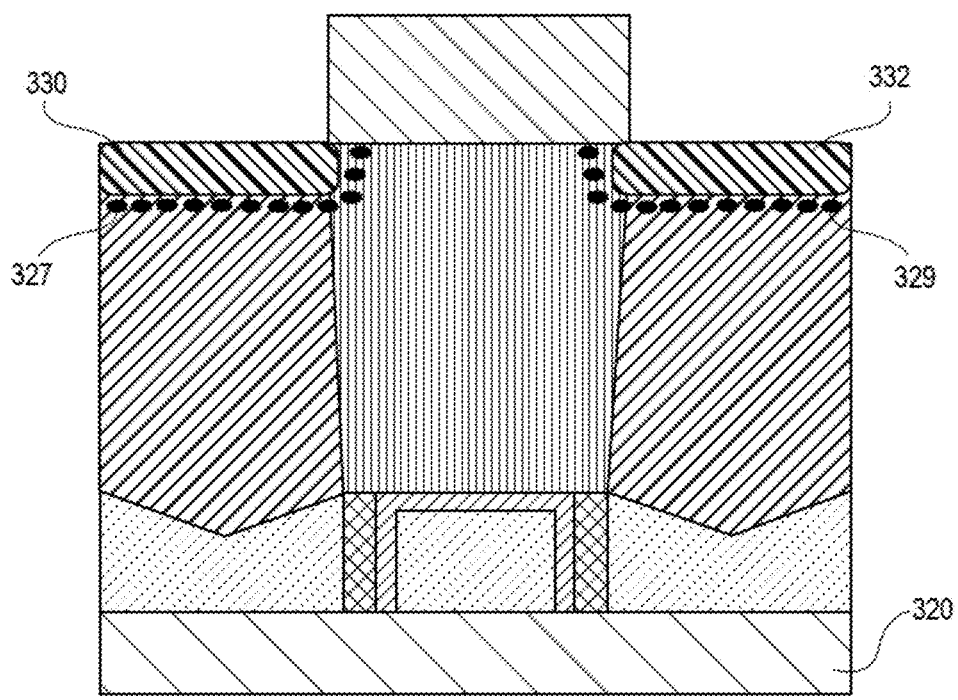
Figure 3E:
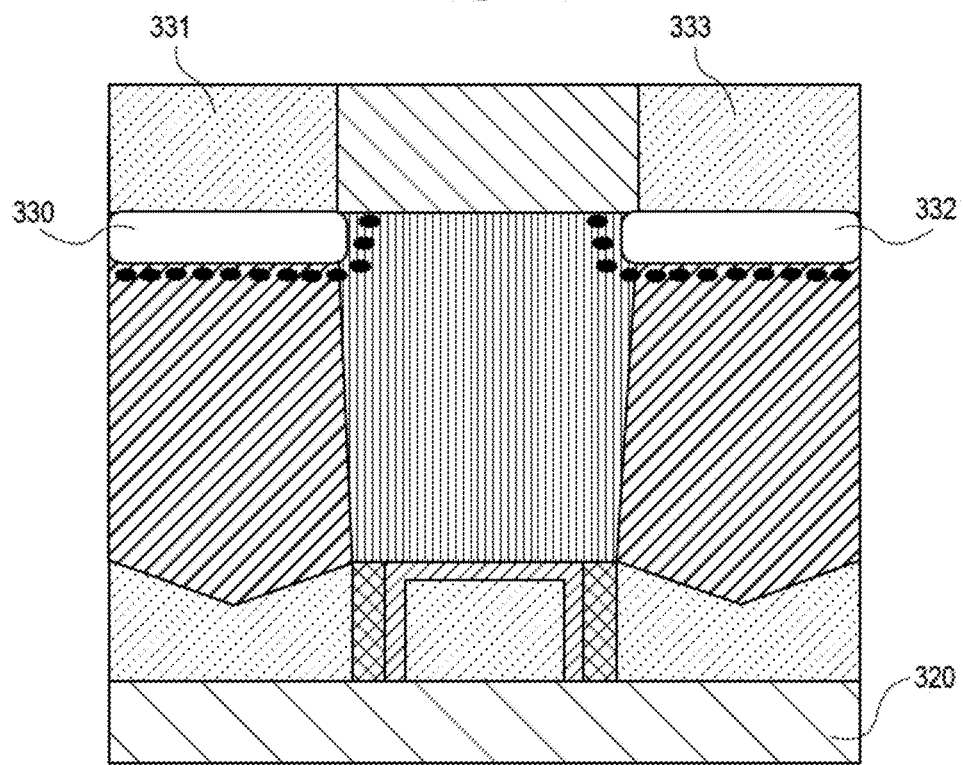
Figure 3F:
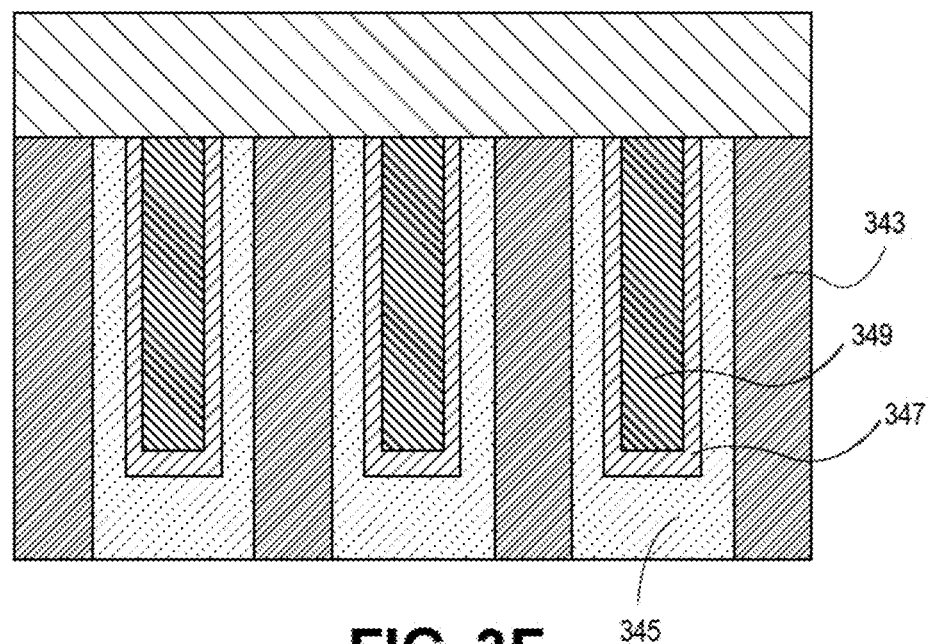
Figure 3G:
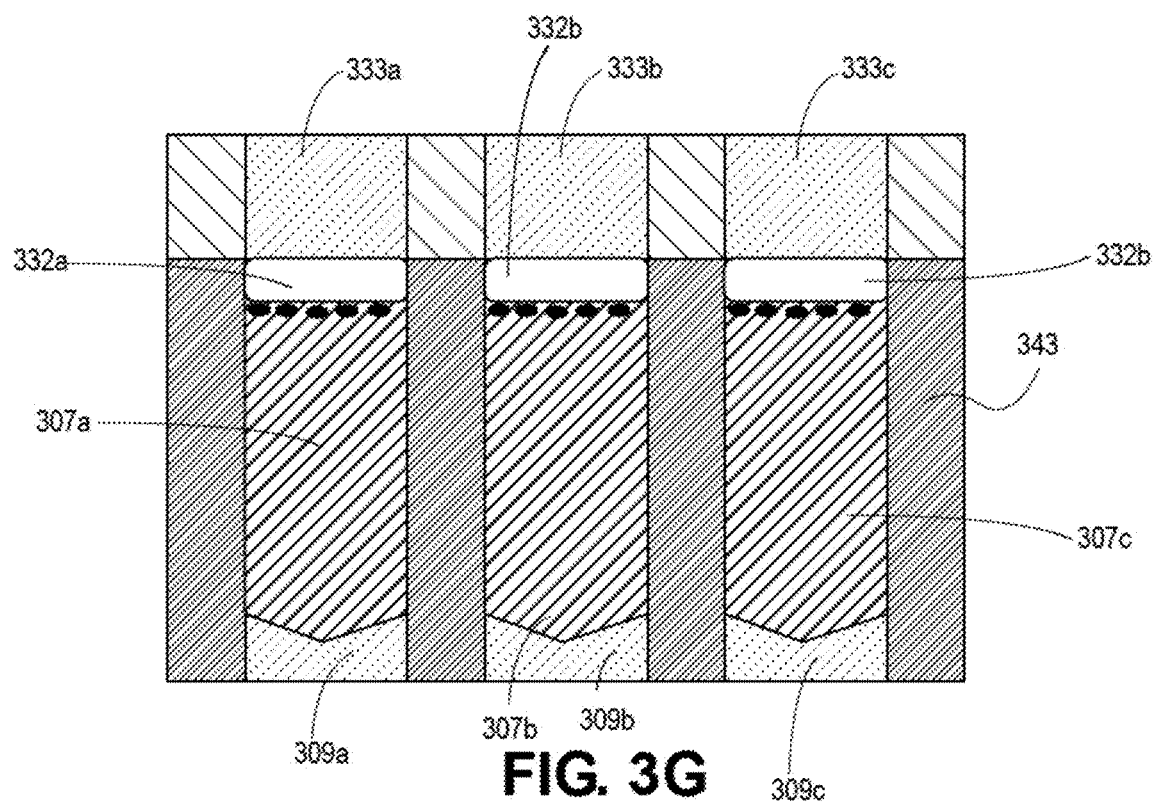

FIGS. 3A-3G show cross-sections of a structure at stages during the fabrication of transistors with bottom-side source-drain recrystallization according to an embodiment. Referring to FIG. 3A, after a plurality of operations the structure includes substrate 301, sacrificial material 303, insulating dielectric 305, source-drain region 307, top-side source-drain contact 309, spacer 311, gate dielectric 313, gate conductor 315, top-side source-drain contact 317, source-drain region 319 and channel material 321. In an embodiment, the substrate 301 is a silicon on insulator (SOI) substrate. In other embodiments, the substrate 301 can be other types of substrates.

Referring to FIG. 3B, subsequent to one or more operations that result in a cross-section of the structure shown in FIG. 3A, a carrier wafer 320 is attached, the wafer is inverted, and the substrate 301 and the sacrificial material 303 are removed. This leaves the bottom surfaces of the source-drain region 307 and the source-drain region 319 exposed. In an embodiment, the substrate 301 and the sacrificial material 303 is removed by a selective etch. In an embodiment, the substrate 301 and the sacrificial material 303 can be removed by isotropic, anisotropic, plasma, ion milling or sputter etching. In other embodiments, the bottom side substrate 301 and the sacrificial material 303 can be removed in other manners.

Referring to FIG. 3C, after one or more operations that result in the cross-section shown in FIG. 3B, ion implantation 321 is made into the exposed surfaces of the source-drain regions 307 and 319. In an embodiment, the implantation results in the formation of amorphized regions 323 and 325. In an embodiment, the insulating dielectric 305 blocks implantation into the channel.

Referring to FIG. 3D, after one or more operations that result in a cross-section shown in FIG. 3C, a thermal anneal is performed. In an embodiment, as a result of the thermal anneal, defects 327 and 329 are formed. In FIG. 3D, the black dots indicate the location of the thermal anneal defects. In an embodiment, the thermal anneal defects can track the contour of the previously amorphized region. In an embodiment, the thermal anneal causes a regrowth/recrystallization of the previously amorphized regions to form regions of highly activated metastable dopants 330 and 332 (hereinafter metastable dopant regions).

Referring to FIG. 3E, after one or more operations that result in a cross-section shown in FIG. 3D, bottom-side contacts 331 and 333 are formed. In an embodiment, either one or both of the bottom-side contacts 331 and 333 can be formed. In addition, in an embodiment, a portion or all of the metastable dopant regions 330 and 332 can form a silicide or germanide with the bottom-side contacts 331 and 333 (the white color indicating the portion of metastable dopant regions 330 and 332 that can be silicided or germanided). In an embodiment, bottom-side contacts 331 and 333 can be formed by atomic layer deposition (ALD), physical vapor deposition (PVD), chemical vapor deposition (CVD), electrochemical deposition (ECD), or molecular beam epitaxy (MBE). In other embodiments, the bottom-side contacts 331 and 333 can be formed in other manners.

FIGS. 3F and 3G show cross-sections of the final structure of FIG. 3E from additional perspectives. In FIG. 3F, the final structure is shown from a cross-sectional perspective centered at a cutline with placement similar to that of cutline 2 shown in FIG. 2C. It should be noted that the cross-section is perpendicular to the fin through the gate where the initial topside is shown oriented downward at the bottom of the semiconductor structure. In FIG. 3F, isolation walls 343 are shown as separating transistor regions that include gate electrode 345, gate dielectric 347 and channel material 349. In FIG. 3G, the final structure is shown from a cross-sectional perspective centered at a cutline having a placement that is similar to that of cutline 3 shown in FIG. 2C. It should be noted that the cross-section is made perpendicular to the fin through the source-drain region. FIG. 3G shows source-drain regions 307a-307c, top-side source-drain contacts 309a-309c, metastable dopant regions 332a-332c, and bottom-side source-drain contacts 333a-333c.

Figure 4A:
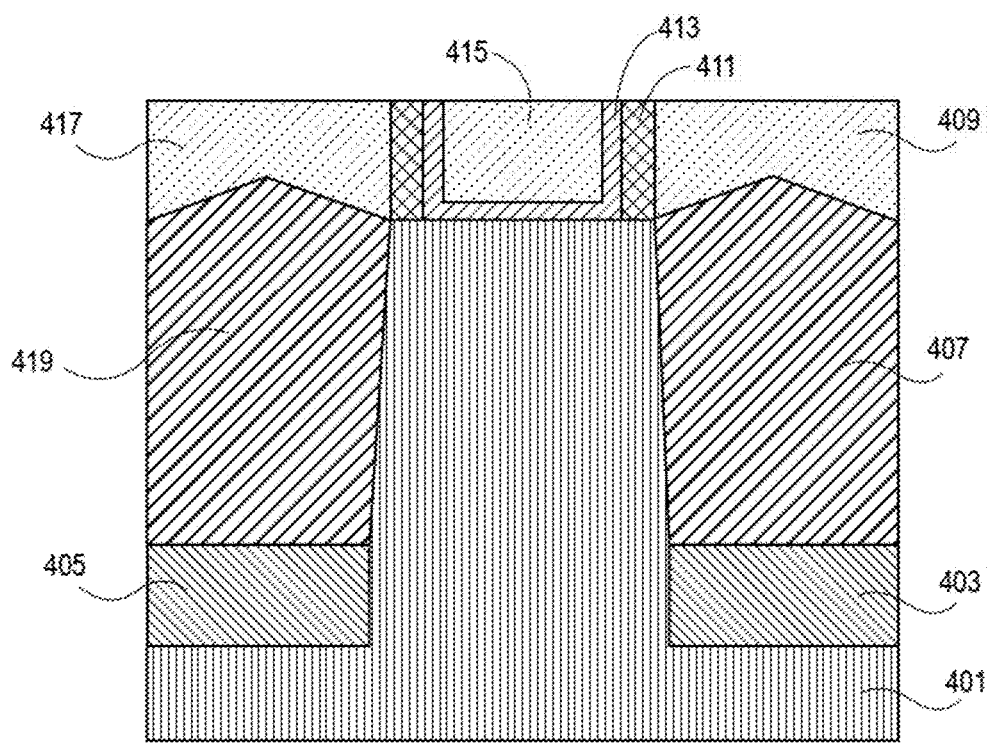
FIGS. 4A-4C illustrate cross-sections of a transistor structure at stages during the process for forming a transistor structure with bottom-side source-drain region recrystallization according to an embodiment.
Figure 4B:
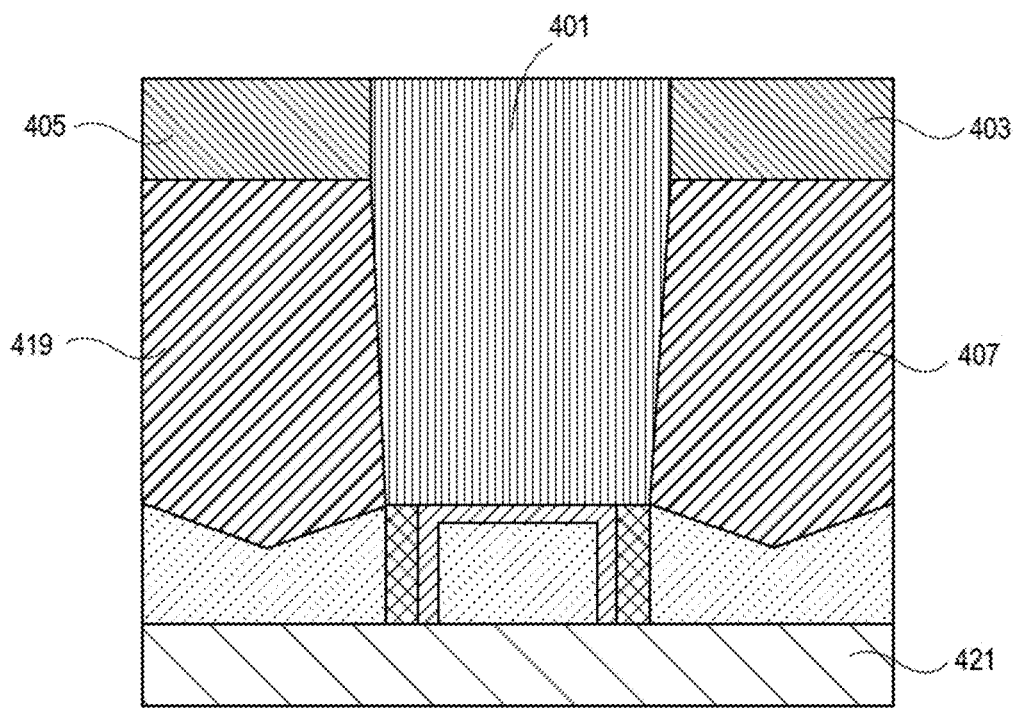
Figure 4C:
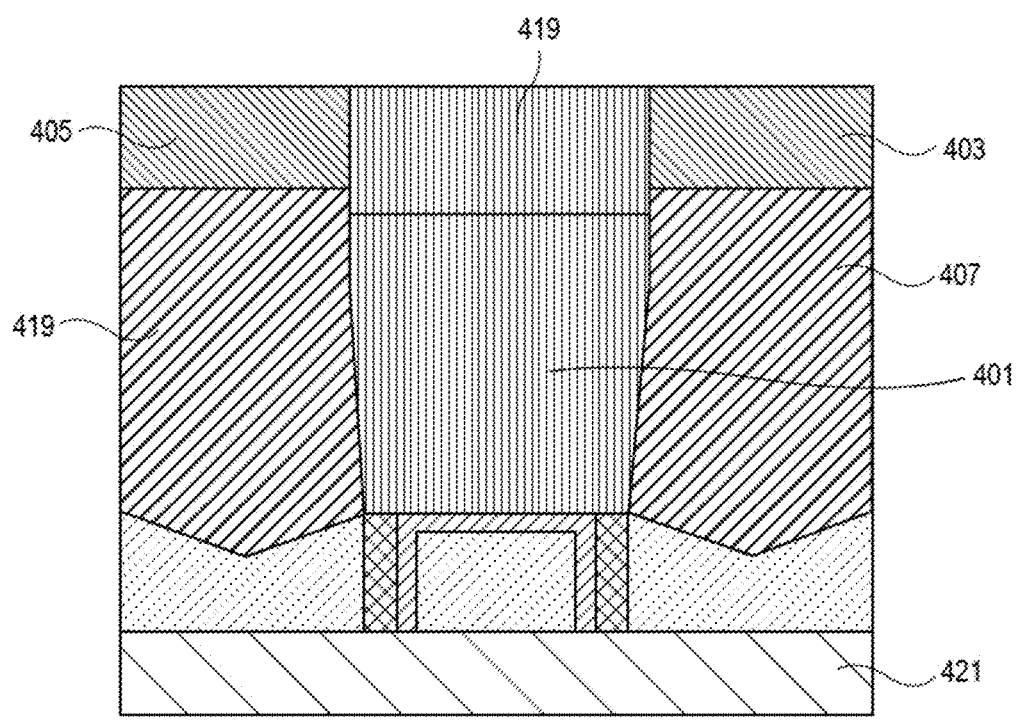

FIGS. 4A-4C shows cross-sections of a semiconductor structure at stages during the fabrication of a transistor with bottom side contact structures according to an embodiment. Referring to FIG. 4A, after a plurality of operations the semiconductor structure includes substrate/channel material 401, sacrificial material 403, sacrificial material 405, source-drain region 407, top-side source-drain contact 409, spacer 411, gate dielectric 413, gate electrode 415, top-side source-drain contact 417, and source-drain region 419.

Referring to FIG. 4B subsequent to one or more operations that result in a cross-section of the structure shown in FIG. 4A, a carrier wafer 421 is attached, the wafer is inverted, and the substrate portion of substrate/channel material 401 is removed. In an embodiment, the substrate material can be removed by a selective etch. Moreover, in an embodiment, the substrate material can be removed by isotropic, anisotropic, plasma etching, ion milling or sputter etching. In other embodiments, the substrate can be removed in other manners.

Referring to FIG. 4C, subsequent to one or more operations that result in the cross-section shown in FIG. 4B, the remaining semiconductor channel material 401 is recessed, and the resulting space filled with a dielectric 419 that is planarized. In an embodiment, the space can be filled with a dielectric oxide. In other embodiments, the space can be filled with other dielectric materials. In an embodiment, the space can be filled by atomic layer deposition (ALD), physical vapor deposition (PVD), chemical vapor deposition (CVD), electrochemical deposition (ECD), or molecular beam epitaxy (MBE). In an embodiment, subsequent, to the operations described with references to FIG. 4C, sacrificial material 403 and sacrificial material 405 can be removed and amorphization and recrystallization operations can proceed similarly as described with reference to FIGS. 3A-3E.

In an embodiment, the process described herein are applicable to both stacked and single-layer transistor processes. In an embodiment, the processes described herein are particularly useful to stacked processes using a monolithic integration scheme (where the lower device strata experiences the full thermal processes of the upper strata devices). In an embodiment, the sacrificial or "colored" material described herein is designed such that it has high etch selectivity relative to the other materials present on the bottom-side of the wafer following the backside reveal process. In some embodiments, this material may be TiN, a carbide, or an oxide. In an embodiment, this material can be a sacrificial material which is inserted beneath the source/drain regions and may be different on NMOS and PMOS devices so as to provide for a means to selectively expose devices of a given polarity. In an embodiment, the channel material can be shaped as a fin, a stack of nanowires or a stack of nanoribbons. In an embodiment, if a stacked semiconductor process is utilized, the individual device strata may be comprised of differently shaped channel regions, with different semiconductor regions used for each strata. In an embodiment, if a stacked semiconductor process is utilized, the amorphization may be performed on just the lowermost device strata or on both device strata. In an embodiment, if a stacked semiconductor process is utilized, a vertical connection (formed with metal or doped semiconductor or metal/semiconductor alloys or compounds including silicides and germanides) may be placed between the source/drain regions where this amorphization/regrowth process will be performed. In an embodiment, the amorphization implant may utilize a doping specie or a non-doping specie. In an embodiment a NMOS device can include an epitaxial silicon doped with phosphorus and/or arsenic which is amorphized from the backside with a phosphorus or arsenic implant of $1e15/cm^2$ to $5e16/cm^2$. In a PMOS embodiment, the amorphization species may be gallium implanted into an epitaxial SiGe layer of greater than 20% Ge fractional composition. This implant may have a dose of $5e14/cm^2$ to $5e16/cm^2$. In an embodiment, a non-doping implant specie such as silicon or germanium may be utilized to facilitate the amorphization from the implant process. In an embodiment, a spacer may be utilized within the region amorphized from the backside so as to pull the implant damage away from the channel region of the device. This spacer may be an oxide, oxy-nitride or other material. In an embodiment, the anneal utilized to regrow the amorphized region can be a laser anneal or an ultra-fast anneal driven from the discharge of a capacitor bank. In an embodiment, where a sacrificial material is inserted beneath the source/drain regions and removed from the bottom-side, a material may be redeposited within the vacated region using the processes described herein. In an embodiment, contacts may be formed to features of the transistor from the bottom-side as described herein. In an embodiment, metal layers and metal routing may be added to the bottom-side of the wafer following these processes. In an embodiment, the resultant defect band can form an upside down "U" shape when a cross-section of the device is cut parallel to the channel and through the middle of the channel. In some embodiments, the bottom device can be a non-transistor device such as a capacitor utilized for a vertical 1T-1C DRAM bitcell formed with a self-aligned stacked architecture.

Figure 5:
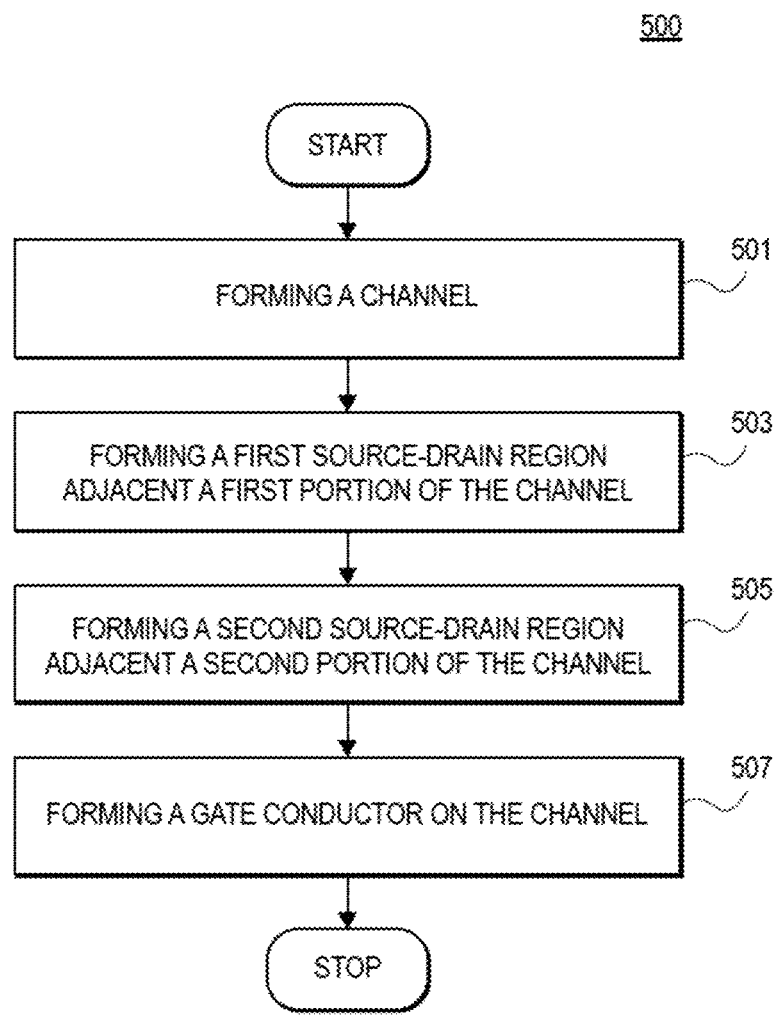
FIG. 5 illustrates a flowchart of a process for forming a transistor structure with bottom-side source-drain region recrystallization according to an embodiment.

FIG. 5 illustrates a flowchart of a method for forming a transistor with raised source-drain contacts according to an embodiment. Referring to FIG. 5, at 501, forming a channel. At 503, forming a first source-drain region adjacent a first portion of the channel, the first source-drain region including a first and a second crystallized (e.g., crystalline) portion, the second crystallized portion including a first metastable portion. At 505, forming a second source-drain region adjacent a second portion of the channel, the second source-drain region including a third and a fourth crystallized (e.g., crystalline) portion, the fourth crystallized portion including a second metastable portion. At 507, forming a gate conductor on the channel. In an embodiment, the method further includes forming a first contact connected to the first source-drain region and a second contact connected to the second source-drain region. In an embodiment, the first source-drain region is formed simultaneously and with the same or similar process operations as the second source-drain region. In other embodiments, the first source-drain region and the second source-drain region can be formed in other manners.

In an embodiment, the method further includes forming a third contact that is connected to the first source-drain region and a fourth contact that is connected to the second source-drain region. In an embodiment, the method includes forming the first contact on a first side of the gate conductor and the second contact on a second side of the gate conductor. In an embodiment, the third contact is underneath the first source-drain region and the fourth contact is underneath the second source-drain region. In an embodiment, the method further includes forming a crystallized (e.g., crystalline) ring on a periphery of the second and fourth crystallized portions. In an embodiment, the second crystallized portion and the fourth crystallized portion includes a concentration gradient of dopants or impurities. In an embodiment, the second crystallized portion and the fourth crystallized portion includes silicide or germanide.

In an embodiment, as part of a vertically oriented transistor structure, a contact can be formed to one of a first and a second source-drain regions. For example, if a first source-drain region is located at the bottom of the wafer and a second source-drain region is located at the top of the wafer.

In an embodiment, the processes described herein can be used to form contacts in non-transistor structures. For example, non-transistor structures that can include but are not limited to inductors, diodes, capacitors, resistors or other devices.

Implementations of embodiments of the invention may be formed or carried out on a substrate, such as a semiconductor substrate. In one implementation, the semiconductor substrate may be a crystalline substrate formed using a bulk silicon, bulk germanium, bulk silicon-germanium, germanium-on-insulator, silicon-germanium-on-insulator or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, or zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, or conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, or aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, porous materials such as organo-silicate glass, or silicon oxynitride. In some embodiments, the sidewall spacer may be formed of multiple layers of differing materials. In some embodiments, the sidewall spacer may be formed of multiple layers of differing materials with one or more of the layers comprising an airgap or vacuum region. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And, in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 6:
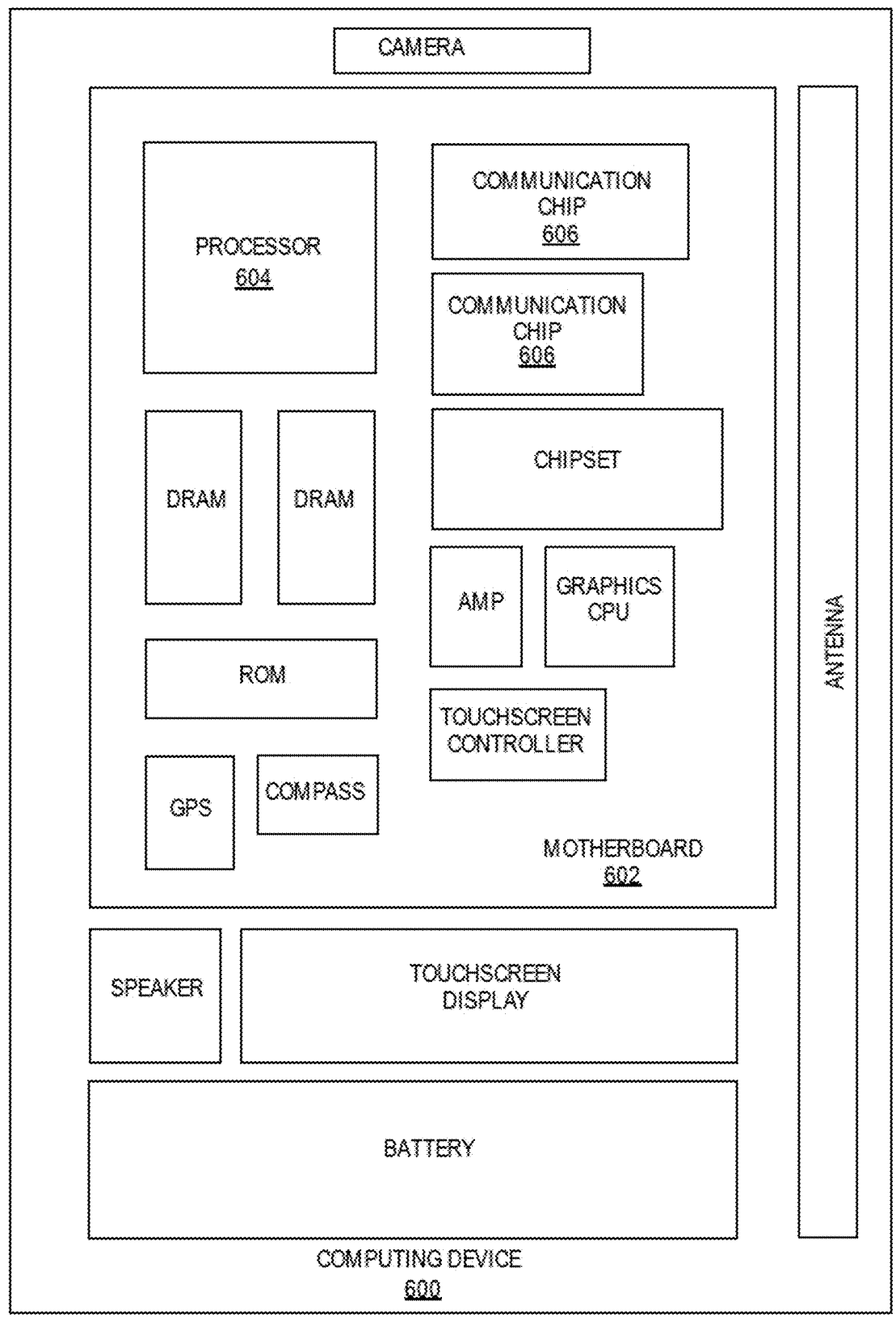
FIG. 6 illustrates a computing device in accordance with one implementation of an embodiment.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). In an embodiment, memory and or logic systems of computing device 600 (such as but not limited to DRAM and/or DRAM that is embedded in logic) can include devices such as transistor 100 described herein with reference to FIG. 1.

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip 606 includes one or more devices, such as MOS-FET transistors built in accordance with implementations of the invention.

In further implementations, another component housed within the computing device 600 may contain an integrated circuit die that includes one or more devices, such as MOS-FET transistors built in accordance with implementations of the invention.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
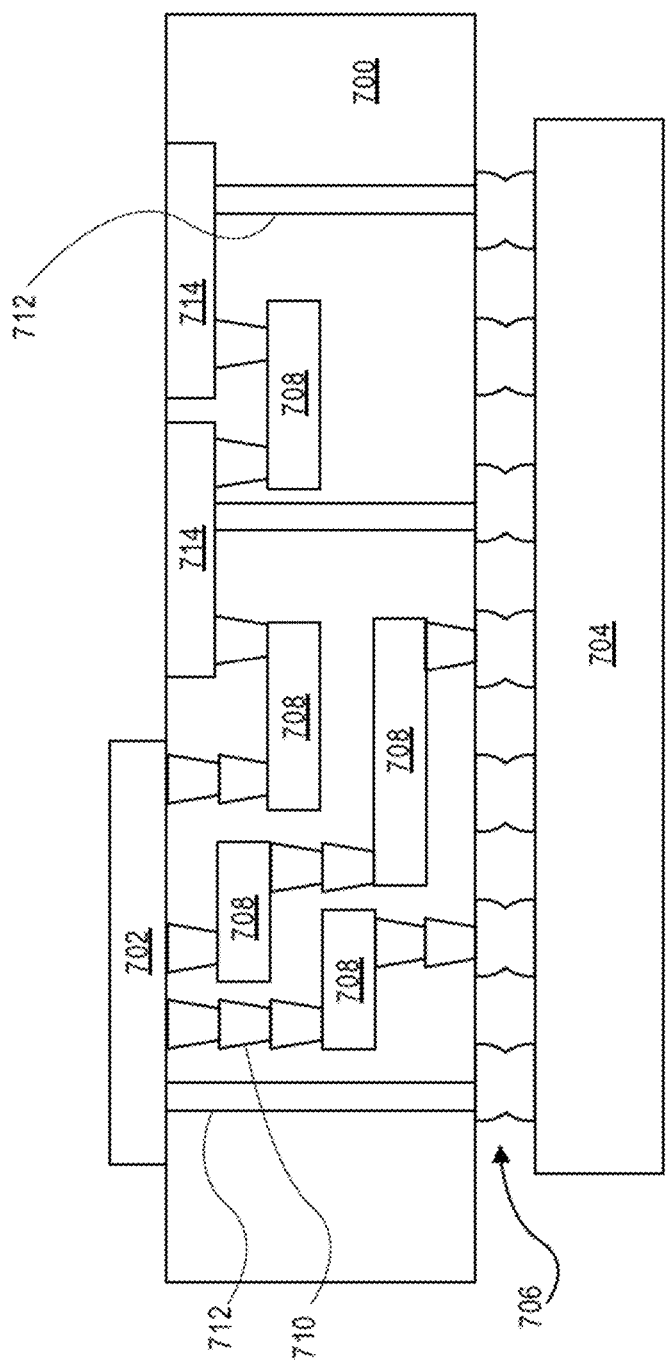
FIG. 7 illustrates an interposer that includes one or more embodiments.

FIG. 7 illustrates an interposer 700 that includes one or more embodiments of the invention. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer 700 may be formed of alternate rigid or flexible materials that may include the same materials described above for use in a semiconductor substrate, such as silicon, germanium, and other group III-V and group IV materials.

The interposer 700 may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the invention, apparatuses or processes disclosed herein may be used in the fabrication of interposer 700.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: A device, comprising: a channel; a first source-drain region adjacent a first portion of the channel, the first source-drain region including a first crystalline portion that includes a first region of metastable dopants; a second source-drain region adjacent a second portion of the channel, the second source-drain region including a second crystalline portion that includes a second region of metastable dopants; and a gate conductor on the channel.

Example embodiment 2: The device of example embodiment 1, further including a first contact connected to the first source-drain region and a second contact connected to the second source-drain region.

Example embodiment 3: The device of example embodiment 1, or 2, further including a third contact connected to the first source-drain region and a fourth contact connected to the second source-drain region.

Example embodiment 4: The device of example embodiment 2, wherein the first contact is on a first side of the gate conductor and the second contact is on a second side of the gate conductor.

Example embodiment 5: The device of example embodiment 3, wherein the third contact is underneath the first source-drain region and the fourth contact is underneath the second source-drain region.

Example embodiment 6: The device of example embodiment 1, 2, 3, 4, or 5, further including a crystalline ring is on a periphery of the first crystalline portion and the second crystalline portion.

Example embodiment 7: The device of example embodiment 1, 2, 3, 4, 5, or 6, wherein the first crystalline portion and the second crystalline portion includes a concentration gradient of dopants.

Example embodiment 8: The device of example embodiment 1, 2, 3, 4, 5, 6, or 7, wherein a part or all of the first crystalline portion and the second crystalline portion includes silicide or germanide.

Example embodiment 9: A system, comprising: one or more processing components; and one or more data storage components, the data storage components including at least one device, the at least one device including: a channel; a first source-drain region adjacent a first portion of the channel, the first source-drain region including a first crystalline portion that includes a first region of metastable dopants; a second source-drain region adjacent a second portion of the channel that includes a second region of metastable dopants; and a gate conductor on the channel.

Example embodiment 10: The system of example embodiment 9, further including a first contact connected to the first source-drain region and a second contact connected to the second source-drain region. example embodiment Example embodiment 11: The system of example embodiment 9, or 10, further including a third contact connected to the first source-drain region and a fourth contact connected to the second source-drain region.

Example embodiment 12: The system of example embodiment 10, wherein the first contact is on a first side of the gate conductor and the second contact is on a second side of the gate conductor.

Example embodiment 13: The system of example embodiment 11, wherein the third contact is underneath the first source-drain region and the fourth contact is underneath the second source-drain region.

Example embodiment 14: The system of example embodiment 9, 10, 11, 12, or 13, further including a crystalline ring on a periphery of the first crystalline portion and the second crystalline portion.

Example embodiment 15: The system of example embodiment 9, 10, 11, 12, 13, or 14, wherein the first crystalline portion and the second crystalline portion includes a dopant concentration gradient.

Example embodiment 16: The system of example embodiment 9, 10, 11, 12, 13, or 14, wherein a part or all of the first crystalline portion and the second crystalline portion includes silicide or germanide.

Example embodiment 17: A method, comprising: forming a carrier wafer; forming a semiconductor structure on the carrier wafer that includes a channel a first source-drain region adjacent a first portion of the channel and a second source-drain region adjacent a second portion of the channel and a gate conductor on the channel; forming sacrificial material to cover the first source-drain region and the second source-drain region; inverting the carrier wafer; removing the carrier wafer; removing the sacrificial material; forming a first implant in the first source-drain region and forming a second implant in the second source-drain region while blocking implantation into the channel region; performing a thermal anneal; and forming a first source-drain contact on the bottom-side of the first source-drain region and a second source-drain contact on the bottom-side of the second source-drain region.

Example embodiment 18: The method of example embodiment 17, wherein the forming the first implant and the forming the second implant causes at least a portion of the first source-drain region and the second source-drain region to change from crystalline to amorphous.

Example embodiment 19: The method of example embodiment 17, or 18, wherein the thermal anneal causes the at least a portion of the first source-drain region and the second source-drain region to recrystallize.

Example embodiment 20: The method of example embodiment 17, 18, or 19, wherein the thermal anneal causes dopant from the first implant and the second implant to become metastable.

Example embodiment 21: The method of example embodiment 17, 18, 19, or 20, wherein the thermal anneal causes the formation of a silicide material or a germanide material adjacent the first source-drain contact and adjacent the second source-drain contact.

Example embodiment 22: The method of example embodiment 17, 18, 19, 20, or 21, wherein the removing the carrier wafer includes stopping on a silicon-on-insulator (SOI) oxide interface.

Example embodiment 23: The method of example embodiment 17, 18, 19, 20, 21, or 22, wherein the removing the sacrificial material includes performing a selective etch of the sacrificial material.

Example embodiment 24: The method of example embodiment 17, 18, 19, 20, 21, 22, or 23, wherein the performing the thermal anneal includes forming a crystalline ring on a periphery of a portion of the first source-drain region and the second source-drain region.

Example embodiment 25: The method of example embodiment 17, 18, 19, 20, 21, 22, 23, or 24, wherein the forming the first implant and forming the second implant causes the formation of a dopant concentration gradient.

Example embodiment 26: A method, comprising: forming a channel; forming a first source-drain region adjacent a first portion of the channel, the first source-drain region including a first crystalline portion that includes a first region of metastable dopants; forming a second source-drain region adjacent a second portion of the channel, the second source-drain region including a second crystalline portion that includes a second region of metastable dopants; and forming a gate conductor on the channel.

Example embodiment 27: The method of example embodiment 26, further including forming a first contact connected to the first source-drain region and a second contact connected to the second source-drain region.

Example embodiment 28: The method of example embodiment 26, or 27, further including forming a third contact connected to the first source-drain region and a fourth contact connected to the second source-drain region.

Example embodiment 29: The method of example embodiment 27, or 28, wherein the first contact is on a first side of the gate conductor and the second contact is on a second side of the gate conductor.

Example embodiment 30: The method of example embodiment 28, wherein the third contact is underneath the first source-drain region and the fourth contact is underneath the second source-drain region.

Example embodiment 31: The method of example embodiment 26, 27, 28, 29 or 30, further including forming a crystalline ring on a periphery of the first crystalline portion and second crystalline portion.

Example embodiment 32: The method of example embodiment 26, 27, 28, 29, 30, or 31, wherein the first crystalline portion and the second crystalline portion includes a dopant concentration gradient.

Example embodiment 33: The method of example embodiment 26, 27, 28, 29, 30, or 31, wherein all or part of at least one of the first crystalline portion and the second crystalline portion includes silicide or germanide.

What is claimed is:
1. A method, comprising:
forming a carrier wafer;
forming a semiconductor structure on the carrier wafer that includes a channel, a first source-drain region adjacent a first portion of the channel, a second source-drain region adjacent a second portion of the channel, and a gate conductor on the channel;
forming sacrificial material to cover the first source-drain region and the second source-drain region;
inverting the carrier wafer;
removing the carrier wafer;
removing the sacrificial material;

forming a first implant in the first source-drain region and forming a second implant in the second source-drain region while blocking implantation into the channel region, wherein forming the first implant and the second implant is performing by implanting the first source-drain region and the second source-drain region from a side of the channel opposite the gate conductor;

performing a thermal anneal; and forming a first source-drain contact on the bottom-side of the first source-drain region and a second source-drain contact on the bottom-side of the second source-drain region.

2. The method of claim 1, wherein the forming the first implant and the forming the second implant causes at least a portion of the first source-drain region and the second source-drain region to change from crystalline to amorphous.

3. The method of claim 1, wherein the thermal anneal causes the at least a portion of the first source-drain region and the second source-drain region to recrystallize.

4. The method of claim 1, wherein the thermal anneal causes dopant from the first implant and the second implant to become metastable.

5. The method of claim 1, wherein the thermal anneal causes the formation of a silicide material or a germanide material adjacent the first source-drain contact and adjacent the second source-drain contact.

6. The method of claim 1, wherein the removing the carrier wafer includes stopping on a silicon-on-insulator (SOI) oxide interface.

7. The method of claim 1, wherein the removing the sacrificial material includes performing a selective etch of the sacrificial material.

8. The method of claim 1, wherein the performing the thermal anneal includes forming a crystalline ring on a periphery of a portion of the first source-drain region and the second source-drain region.

9. The method of claim 1, wherein the forming the first implant and forming the second implant causes the formation of a dopant concentration gradient.

* * * * *